United States Patent
Song

(10) Patent No.: US 7,864,910 B2
(45) Date of Patent: Jan. 4, 2011

(54) PHASE LOCKED LOOP

(75) Inventor: Keun-Soo Song, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 847 days.

(21) Appl. No.: 11/647,642

(22) Filed: Dec. 29, 2006

(65) Prior Publication Data

US 2008/0002802 A1    Jan. 3, 2008

(30) Foreign Application Priority Data

Jun. 29, 2006    (KR) ........................... 2006-0059071

(51) Int. Cl.
*H03D 3/24*    (2006.01)
(52) U.S. Cl. .................. 375/374; 375/375; 375/327; 327/156; 341/155; 331/17; 331/78; 331/100
(58) Field of Classification Search ................ 341/155; 327/156; 331/17, 78, 100; 375/374, 375, 375/327
See application file for complete search history.

(56) References Cited

U.S. PATENT DOCUMENTS

| | | | |
|---|---|---|---|
| 5,272,452 A * | 12/1993 | Adachi et al. ................. | 331/17 |
| 6,029,250 A | 2/2000 | Keeth | |
| 6,912,680 B1 | 6/2005 | Keeth | |
| 2002/0167365 A1 * | 11/2002 | Smith ......................... | 331/100 |
| 2004/0239545 A1 * | 12/2004 | Tsai et al. .................... | 341/155 |
| 2005/0030114 A1 * | 2/2005 | Starr et al. .................... | 331/78 |
| 2006/0066759 A1 | 3/2006 | Ikuma et al. | |
| 2007/0146024 A1 * | 6/2007 | Allan .......................... | 327/156 |

FOREIGN PATENT DOCUMENTS

| | | |
|---|---|---|
| JP | 63-288518 | 11/1988 |
| JP | 04-107011 | 4/1992 |
| JP | 2000-332603 | 11/2000 |
| KR | 2003-0056311 | 7/2003 |

* cited by examiner

*Primary Examiner*—Sudhanshu C Pathak
(74) *Attorney, Agent, or Firm*—Blakely, Sokoloff, Taylor & Zafman

(57) ABSTRACT

A PLL is provided with an optimum operating point in order to have appropriately a frequency margin and a locking time. There is provided a phase looked loop which includes: a frequency divider for dividing an output signal by a dividing integer corresponding to an input code; an encoding unit for encoding the input code to generate an encoded code; and a loop filtering unit configured to adjust elements in response to the encoded code.

14 Claims, 3 Drawing Sheets

PHASE LOCKED LOOP

CROSS-REFERENCE TO RELATED APPLICATIONS

The present invention claims priority of Korean patent application number 10-2006-0059071, filed on Jun. 29, 2006, which is incorporated by reference in its entirety.

BACKGROUND OF THE INVENTION

The present invention relates to electronic circuits; more particular, to a phase locked loop (PLL) for use in semiconductor devices and integrated circuits.

A PLL is a circuit that generates a periodic output signal having a constant phase and frequency with respect to a periodic input signal. The PLL is widely used in various types of measurements, microprocessors and wireless/wired telecommunication applications. The PLL is included in a circuit such as a phase adjusting circuit, a frequency synthesizer and a clock distribution circuit in a system for outputting signals having a consistent frequency and phase.

FIG. 1 shows a block diagram of a conventional phase-locked loop (PLL). The conventional PLL has a main signal path constituted with a phase-frequency detector 101, a charge pump 102, a loop filter 103 and a voltage-controlled oscillator (VCO) 104 and a feedback signal path constituted with a divider 105. The phase-frequency detector 101 compares a phase of an input reference clock signal 100 having a frequency Fref with a phase of a feedback signal 106 having a frequency Fdiv. Based on a comparison result, the phase-frequency detector 101 generates a comparison signal such as an up signal UP or a down signal DOWN, where the magnitude of the comparison signal indicates a phase difference between the input reference clock signal 100 and feedback signal 106. When the phase of the input reference clock signal 100 leads the phase of the feedback signal 106, the phase-frequency detector 101 generates the signal UP. Otherwise, when the phase of the reference signal 100 lags the phase of feedback signal 106, the phase-frequency detector 101 generates the down signal DOWN. The charge pump 102 generates an amount of positive or negative charge Q based on the comparison signal and supplies the positive or negative charge to the loop filter 103 which operates as an integrator accumulating the amount of charge Q from the charge pump 102. The loop filter 103 generates a loop filtering voltage $V_{LF}$ corresponding to the amount of the charge Q. The loop filtering voltage $V_{LF}$ is supplied to the VCO 104 which generates a periodic VCO output signal 107 whose frequency $F_{VCO}$ is decided by a level of the loop filter voltage $V_{LF}$, where the VCO output signal 107 is an output signal of the convention PLL.

The VCO output signal 107 is also supplied to the divider 105 for generating the feed back signal 106 by dividing the VCO output signal 107 by an integer N corresponding to an input code CODE. For example, the frequency $F_{VCO}$ of the VCO output signal 105 divided by 2 as a dividing integer is twice as large as the VCO output signal 107 decided by 1. The dividing integer N can be appropriately determined based on the variation of the input code CODE. Then, the VCO output signal 107 having a various frequency can be outputted.

However, characteristics of the conventional PLL can be distorted due to change of the integer N. Especially, the loop filter 103 can be adversely affected due to change of the integer N. In order that the conventional PLL be operated on an adequate frequency margin and locking time, configured values of the loop filter in the conventional PLL should be appropriately adjusted in response to the change of the integer N. That is, capacitances and resistances of elements included in the loop filter 103 must be adjusted.

FIG. 2 shows a loop filter of the conventional PLL in FIG. 1. The loop filter 103 including two capacitors C1 and C2 and a resistor R which operate as a low pass filter. Described above, in response to the change of the dividing integer N of the divider 105, the capacitance of the capacitors C1 and C2 and the resistance of the resistor R must be appropriately adjusted. Accordingly, the operating point of the loop filter 103 can be included.

However, elements, included in the conventional PLL, have fixed values of elements such as the capacitors C1 and C2 and the resistor R. Therefore, although the dividing integer N of the divider 105 is changed, the operating point of the loop filter 103 cannot be adjusted. Finally the conventional PLL can not be operated at optimum operating condition in order to obtain appropriately a frequency margin and a locking time.

SUMMARY OF THE INVENTION

Embodiments of the present invention are directed to provide PLL with an optimum operating condition in order to obtain appropriately a frequency margin and a locking time In accordance with an aspect of the present invention, there is provided a phase looked loop including: a frequency divider for dividing an output signal by a dividing integer corresponding to an input code; an encoding unit for encoding the input code to generate an encoded code; and a loop filtering unit configured to adjust elements in response to the encoded code.

In accordance with another aspect of the present invention, there is provided a phase-frequency detector for detecting a frequency difference and a phase difference between a reference signal and a feedback signal; a charge pump for generating charge quantities based on the detecting result; a loop filtering unit for generating a voltage signal having a voltage level corresponding to the charge quantities wherein the loop filtering unit is configured to the capacitors and resistor whose capacitances and resistance are adjusted in response to an input code, respectively; a voltage-controlled oscillator for generating output signal having a frequency and a phase correspond to the voltage signal; and a frequency divider for dividing the output signal by a dividing integer corresponding to the input code.

DESCRIPTION OF SPECIFIC EMBODIMENTS

Figure 3:
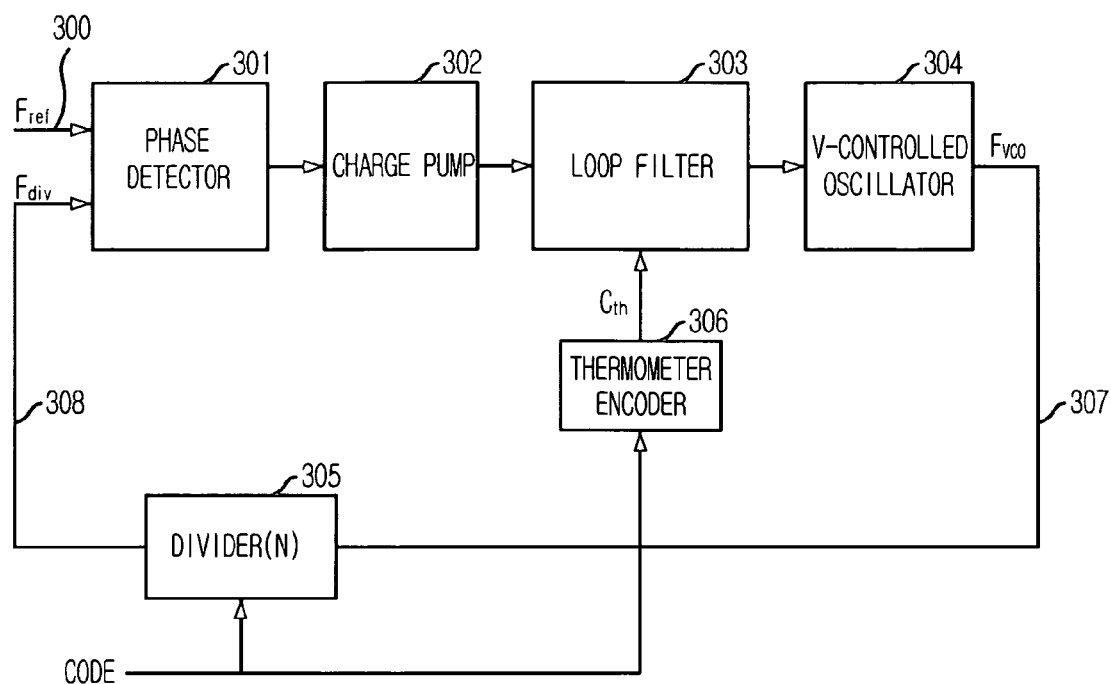
FIG. 3 shows a block diagram of an exemplary embodiment of a PLL in accordance to the present invention.

FIG. 3 shows a block diagram of an exemplary embodiment of a PLL in accordance with the present invention. The PLL has a main signal path constituted with a phase-frequency detector 301, a charge pump 302, a loop filter 303 controlled by a thermometer encoder 306 and a VCO 304 and a feedback signal path constituted with a divider 305 where divides a VCO output signal 307 in response to a dividing integer N corresponding to an input code CODE. The thermometer encoder 306 encodes the input code CODE to generate a thermometer code Cth. The phase-frequency detector 301, the charge pump 302, the VCO 304 and the divider 305 have analogous elements as shown in PLL of FIG. 1. In fact, the phase-frequency detector 301, the charge pump 302, the VCO 304 and the divider 305 can be similar to the corresponding elements in FIG. 1, but a difference between the PLL of FIG. 3 and the PLL of FIG. 1 lies in the configuration and the operation of the loop filter 303 because of the existence of the thermometer encoder 306.

Figure 1:
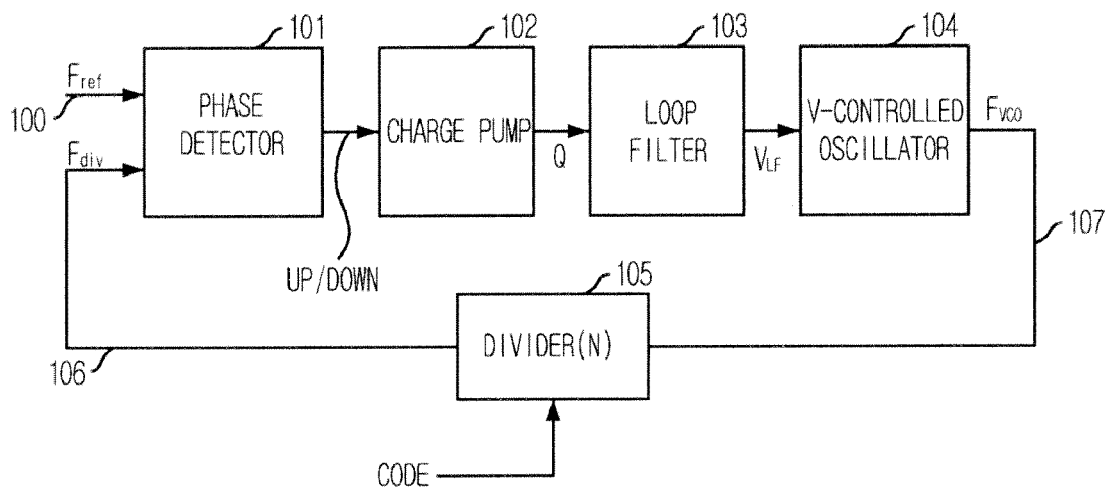
FIG. 1 shows a block diagram of a conventional phase-locked loop (PLL).

Unlike the loop filter 103 of FIG. 1 which is configured by elements having fixed values, the loop filter 303 of FIG. 3 has variable elements. That is, the resistance of resistor and the capacitances of capacitors in the loop filter 303 can be variable corresponding to the input code CODE.

To configure the loop filter 303 having an optimizing resistance and capacitances in response to the dividing integer N by the divider 305, it must be checked what the optimum values of elements included in the loop filter 303 are as the dividing integer N changes. The optimum values of elements configured in the loop filter 303 are described in Table. 1 as the dividing integer N changes.

TABLE 1

| N | C1 (F) | C2 (F) | R (ohm) |
|---|--------|--------|---------|
| 1 | 1.08p  | 10.5p  | 9.9k    |
| 2 | 0.361p | 5.26p  | 19k     |
| 4 | 0.271p | 2.63p  | 36k     |
| 8 | 0.135p | 1.3p   | 79k     |
| 16| 0.0678p| 0.66p  | 158.4k  |

(Design condition: Kvco = 140 Mhz/V, Icp = 0.025 mA, Loop BW = 5 Mhz, PM = 56)

As indicated in Table 1, the optimum capacitances of the capacitors C1 and C2 increase in inverse proportion to the dividing integer N and the optimum resistance of the resistor increases in proportion to the dividing integer N. Therefore, as the dividing integer N increase, the capacitances of the capacitors C1 and C2 should decrease and the resistance of the resistor should increase, in proportion to the number N, so that the optimal loop filter performs a desirable operation.

The thermometer encoder 306 receives the input code CODE to generate the thermometer code Cth corresponding to the dividing integer N. In detail, the thermometer code Cth has the number of logic high levels corresponding to the dividing integer N. The thermometer encoder 306 having a plurality of signal output pins outputs logic high level and logic low level signals corresponding to the dividing integer N. In this case, although the thermometer encoder 306 is used for encoding the input code CODE, in other exemplary embodiments, the input code CODE can be generated with other encoders such as a barometer encoder. Table 2 indicates the thermometer code Cth generated by the thermometer encoder 306 and the dividing integer N decided by the divider 305, when the input code CODE is inputted to the divider 305 and the thermometer encoder 306 respectively.

TABLE 2

|    | input code | N | Cth              |
|----|------------|---|------------------|
| 1  | 0001       | 1 | 0000000000000001 |
| 2  | 0010       | 2 | 0000000000000011 |
| 3  | 0011       | 3 | 0000000000000111 |
| 4  | 0100       | 4 | 0000000000001111 |
| 5  | 0101       | 5 | 0000000000011111 |
| 6  | 0110       | 6 | 0000000000111111 |

TABLE 2-continued

|    | input code | N  | Cth              |
|----|------------|----|------------------|
| 7  | 0111       | 7  | 0000000001111111 |
| 8  | 1000       | 8  | 0000000011111111 |
| 9  | 1001       | 9  | 0000000111111111 |
| 10 | 1010       | 10 | 0000001111111111 |
| 11 | 1011       | 11 | 0000011111111111 |
| 12 | 1100       | 12 | 0000111111111111 |
| 13 | 1101       | 13 | 0001111111111111 |
| 14 | 1110       | 14 | 0011111111111111 |
| 15 | 1111       | 15 | 0111111111111111 |

For example, when the input code is '0100', the divider 305 divides the VCO output signal 307 by the dividing integer 4 to generate a feedback signal 308 to the phase-frequency detector 301 and the thermometer encoder 306 generates the encoded thermometer code Cth '0000000000001111'.

Figure 4:
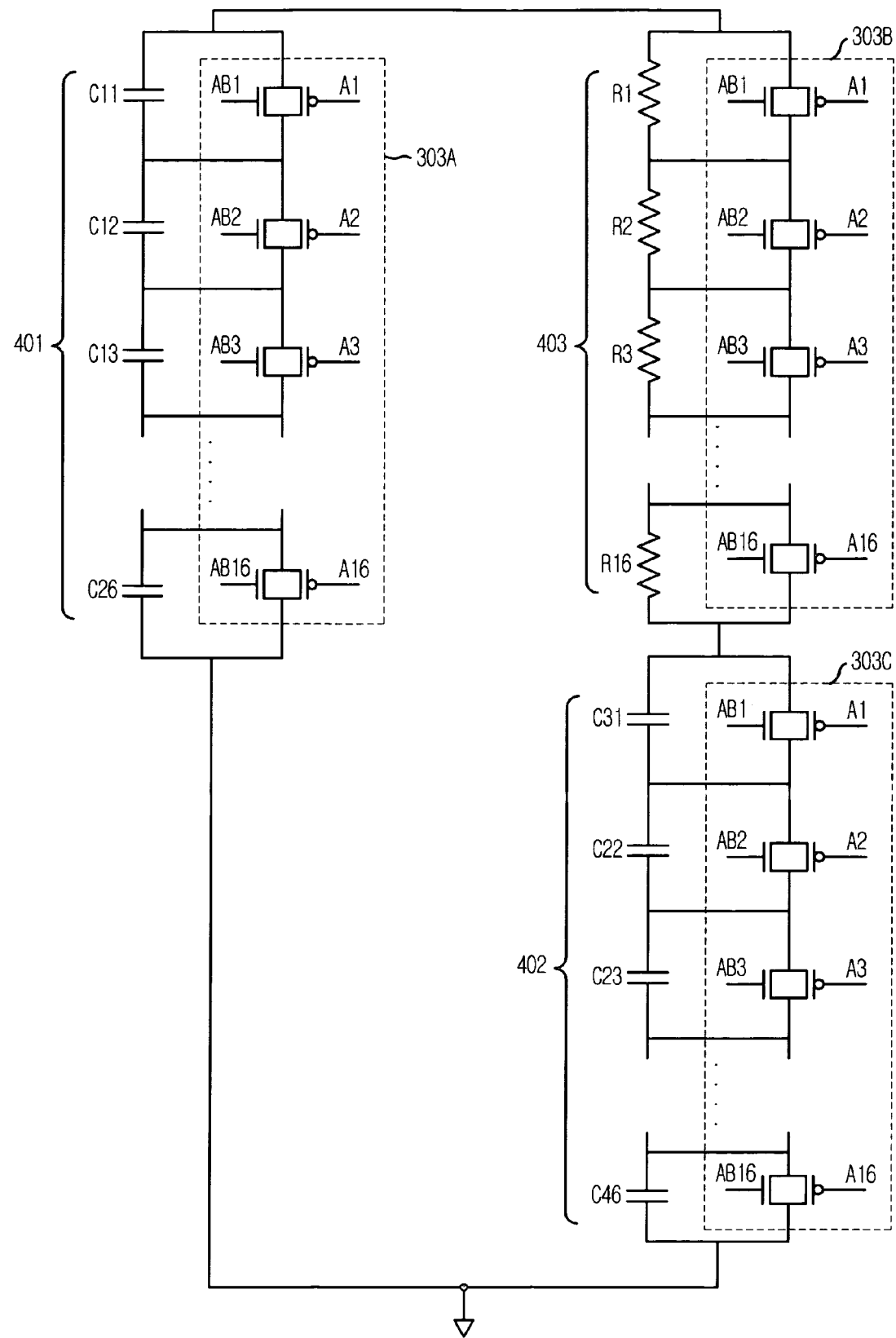
FIG. 4 shows an exemplary schematic diagram of the loop filter in FIG. 3.

FIG. 4 shows an exemplary schematic diagram of the loop filter in FIG. 3. Sixteen capacitors C11 to C26 coupled in series correspond to the capacitor C1 in FIG. 2. The sixteen capacitors C31 to C46 coupled in series correspond to the capacitor C2 in FIG. 2; and sixteen resistors R11 to R26 coupled in series correspond to the resistor R in FIG. 2. Although the number of each of the elements in this loop filter is 16, the number of respective elements in other loop filters according to other exemplary embodiments can be changed. Also, element-value selecting units 303A to 303C are respectively corresponded to the elements of the loop filter in FIG. 4.

The element-value selecting units 303A to 303C include sixteen transmission gates in series, respectively. The element-value selecting units 303A to 303C turn on the number of the transmission gates corresponding to the number of the logic low levels of the thermometer code Cth from the thermometer encoder 306, respectively.

For instance, if the dividing integer is '1', the thermometer code Cth is encoded as '0000000000000001'. Then, first to fifteenth transmission gates in each of the element-value selecting units 303A to 303C are respectively turned on and sixteenth transmission gates in each of the element-value selecting units 303A to 303C are respectively turned off. Therefore, the capacitors C26 and C46 and the resistor R16 are operated according to turned-on transmission gates. Referring to Table 1, capacitances of the capacitors C1 and C2 can be respectively set into 1.08 p and 10.5 p and the resistance of the resistor R16 can be set into 9.9 k.

Figure 2:
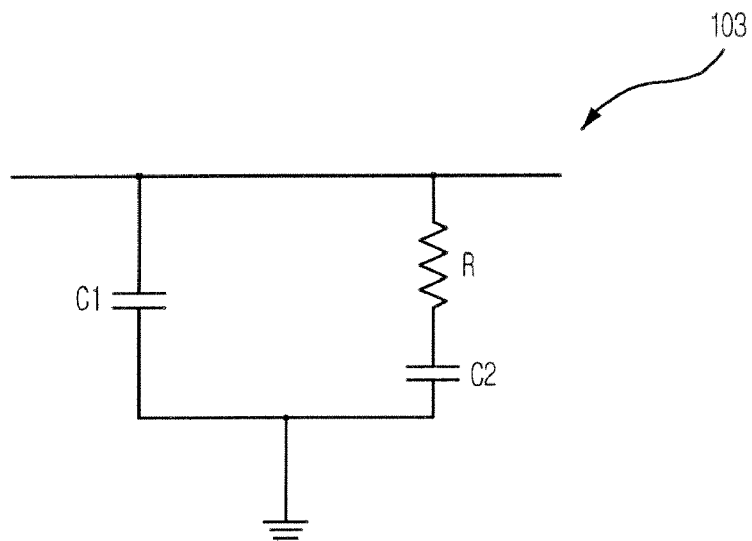
FIG. 2 shows a loop filter of the conventional PLL in FIG. 1.

In case that the dividing integer is '2', through the same mechanism, the capacitors C26, C25, C45 and C46 and the resistors R15 and R16 serve as elements of the loop filter. The capacitances and resistance of elements in FIG. 4 corresponding to the elements C1, C2 and R in FIG. 2 is given by Equations (1) to (3) as follows:

$$1/C25 + 1/C26 = 1/C1 \qquad (1)$$

$$1/C45 + 1/C46 = 1/C2 \qquad (2)$$

$$R = R1 + R2 \qquad (3)$$

If the capacitances and resistance of elements corresponding to the elements C1, C2 and R in FIG. 1 are set as indicated in Table 1, the loop filter can be configured by the elements having optimum values when the dividing integer N increases. Therefore, the PLL including the loop filter can be operated optimally operating point when the dividing integer N increases.

The element-value selecting units 303A to 303C can be configured with a plurality of PMOS transistors. In that case, a corresponding PMOS transistor has a gate connected to a corresponding signal of the thermometer code Cth and one terminal and other terminal respectively connected to one terminal and other terminal of corresponding elements, i.e., capacitor or resistor. Also, the element-value selecting units 303A to 303C can be configured by a plurality of NMOS transistors. In that case, a corresponding NMOS transistor has a gate connected to an inversion signal of a corresponding signal of the thermometer code Cth and one terminal and other terminal respectively connected to one terminal and other terminal of corresponding elements.

Finally, PLL by the present invention can be set optimally in order to have appropriately a frequency margin and a locking time because each element of the loop filter has optimum values when the dividing integer N increases.

While the present invention has been described with respect to the specific embodiments, it will be apparent to those skilled in the art that various changes and modifications may be made without departing from the spirit and scope of the invention as defined in the following claims.

What is claimed is:

1. A phase looked loop, comprising:
a phase detector;
an oscillator which generates an output signal;
a frequency divider for dividing the output signal based on a variable input code for determining a dividing integer which is input to said phase detector as a feedback signal;
an encoding unit for-encoding the input code to generate an encoded code a plurality of signals, each being one of a logic high and a logic low based on the input code;
a loop filtering unit including a plurality of selecting units, each of said selecting units having a plurality of inputs which correspond to said plurality of signals and a plurality of series connected resistors and series connected capacitors, each corresponding to said plurality of inputs, wherein each of said capacitors and resistors operates according to the logic level of the signal provided to its corresponding selecting unit input, wherein said loop filtering unit receives an input signal based on an output from said phase detector and filters said received input signal based on an operating state of said resistors and capacitors, and provides said filtered received signal to said oscillator;
wherein the loop filtering unit further comprises:
a plurality of first transmission gates in series wherein the first transmission gates correspond to the first capacitors;
a plurality of second transmission gates in series wherein the second transmission gates correspond to the second capacitors;
and a plurality of third transmission gates in series wherein the third transmission gates correspond to the resistors;
and further wherein the plurality of series connected capacitors comprises:
a plurality of first capacitors in series;
a plurality of second capacitors in series wherein the second capacitors are coupled to the first capacitors in parallel and coupled to the resistors in series.

2. The phase looked loop of claim 1, wherein the plurality of selecting units includes a plurality of transmission gates in series.

3. The phase looked loop of claim 1, wherein the plurality of series connected capacitors comprises:
a plurality of first capacitors in series;
a plurality of second capacitors in series wherein the second capacitors are coupled to the first capacitors in parallel and coupled to the resistors in series; and
wherein the loop filtering unit further comprises
a plurality of first PMOS transistors in series and corresponding to the first capacitors wherein the first PMOS transistors each have a first terminal and a second terminal connected to a first terminal and a second terminal of a corresponding first capacitor, respectively;
a plurality of second PMOS transistors in series and corresponding to the second capacitors wherein the second PMOS transistors each have a first terminal and a second terminal connected to a first terminal and a second terminal of a corresponding second capacitor, respectively; and
a plurality of third PMOS transistors in series and corresponding to the resistors wherein the third PMOS transistors each have a first terminal and a second terminal connected to a first terminal and a second terminal of a corresponding resistor, respectively.

4. The phase looked loop of claim 1, wherein the plurality of series connected capacitors comprises:
a plurality of first capacitors in series;
a plurality of second capacitors in series wherein the second capacitors are coupled to the first capacitors in parallel and coupled to the resistors in series; and
wherein the loop filtering unit further comprises
a plurality of first NMOS transistors in series and corresponding to the first capacitors wherein the first NMOS transistors each have a first terminal and a second terminal connected to a first terminal and a second terminal of a corresponding first capacitor, respectively;
a plurality of second NMOS transistors in series and corresponding to the second capacitors wherein the second NMOS transistors each have a first terminal and a second terminal connected to a first terminal and a second terminal of a corresponding second capacitor, respectively; and
a plurality of third NMOS transistors in series and corresponding to the resistors wherein the third NMOS transistors each have a first terminal and a second terminal connected to a first terminal and a second terminal of a corresponding resistor, respectively.

5. The phase looked loop of claim 1, wherein the first and second capacitors have the same capacitance and the resistors have the same resistance, respectively.

6. The phase looked loop of claim 1, wherein the capacitances of the capacitors decreases and the resistances of the resistors increases as the dividing integer increases.

7. The phase looked loop of claim 1, wherein the encoding unit includes a thermometer encoder.

8. A phase looked loop, comprising:
a phase-frequency detector for detecting a frequency difference and a phase difference between a reference signal and a feedback signal;
a charge pump for generating charge quantities based on the detecting result;
a loop filtering unit including an encoding unit for encoding the input code to generate a plurality of signals, each being one of a logic high and a logic low based on the input code, said loop filtering unit for generating a voltage signal having a voltage level corresponding to the charge quantities wherein the loop filtering unit includes a plurality of selecting units, each of said selecting units having a plurality of inputs which correspond to said plurality of signals and a plurality of series connected resistors and series connected capacitors, each corresponding to said plurality of inputs, wherein each of said capacitors and resistors operates according to the logic level of the signal provided to its corresponding selecting unit input, wherein said loop filtering unit receives an input signal based on an output from said phase detector and filters said received input signal based on an operating state of said resistors and capacitors, and provides said filtered received signal to said oscillator;

a voltage-controlled oscillator for generating an output signal having a frequency and a phase corresponding to the voltage signal;

a frequency divider for dividing the output signal by a dividing integer in response to the input code, wherein the resistances and capacitances of the capacitors and resistor included in the loop filtering unit are changed as the dividing integer changes;

wherein the loop filtering unit further comprises:
a plurality of first transmission gates in series wherein the first transmission gates correspond to the first capacitors;
a plurality of second transmission gates in series wherein the second transmission gates correspond to the second capacitors;
and a plurality of third transmission gates in series wherein the third transmission gates correspond to the resistors;

and further wherein the plurality of series connected capacitors further comprises:
a plurality of first capacitors in series;
a plurality of second capacitors in series wherein the second capacitors are coupled to the first capacitors in parallel and coupled to the resistors in series.

9. The phase looked loop of claim 8, wherein the plurality of selecting units includes a plurality of transmission gates in series.

10. The phase looked loop of claim 8, wherein the plurality of series connected capacitors comprises:
a plurality of first capacitors in series;
a plurality of second capacitors in series wherein the second capacitors are coupled to the first capacitors in parallel and coupled to the resistors in series; and
wherein the loop filtering unit further comprises
a plurality of first PMOS transistors in series and corresponding to the first capacitors wherein the first PMOS transistors each have a first terminal and a second terminal connected to a first terminal and a second terminal of a corresponding first capacitor, respectively;
a plurality of second PMOS transistors in series and corresponding to the second capacitors wherein the second PMOS transistors each have a first terminal and a second terminal connected to a first terminal and a second terminal of a corresponding second capacitor, respectively; and
a plurality of third PMOS transistors in series and corresponding to the resistors wherein the third PMOS transistors each have a first terminal and a second terminal connected to a first terminal and a second terminal of a corresponding resistor, respectively.

11. The phase looked loop of claim 8, wherein the plurality of series connected capacitors comprises:
a plurality of first capacitors in series;
a plurality of second capacitors in series wherein the second capacitors are coupled to the first capacitors in parallel and coupled to the resistors in series; and
wherein the loop filtering unit further comprises
a plurality of first NMOS transistors in series and corresponding to the first capacitors wherein the first NMOS transistors each have a first terminal and a second terminal connected to a first terminal and a second terminal of a corresponding first capacitor, respectively;
a plurality of second NMOS transistors in series and corresponding to the second capacitors wherein the second NMOS transistors each have a first terminal and a second terminal connected to a first terminal and a second terminal of a corresponding second capacitor, respectively; and
a plurality of third NMOS transistors in series and corresponding to the resistors wherein the third NMOS transistors each have a first terminal and a second terminal connected to a first terminal and a second terminal of a corresponding resistor, respectively.

12. The phase looked loop of claim 8, wherein the first and second capacitors have the same capacitance and the resistors have the same resistance, respectively.

13. The phase looked loop of claim 8, wherein the capacitances of the capacitors decreases and the resistances of the resistors increases as the dividing integer increases.

14. The phase looked loop of claim 8, wherein the encoding unit includes a thermometer encoder.

* * * * *